United States Patent
Sheu et al.

(10) Patent No.: US 7,960,740 B2
(45) Date of Patent: Jun. 14, 2011

(54) STRUCTURE OF LIGHT EMITTING DIODE AND METHOD TO ASSEMBLE THEREOF

(75) Inventors: Sheng-Jia Sheu, Banciao (TW); Chien-Chang Pei, Linkou Township, Taipei County (TW)

(73) Assignee: Everlight Electronics Co., Ltd., Tu Chen, Taipei Hsien (TW)

( * ) Notice: Subject to any disclaimer, the term of this patent is extended or adjusted under 35 U.S.C. 154(b) by 0 days.

(21) Appl. No.: 12/012,379

(22) Filed: Feb. 1, 2008

(65) Prior Publication Data

US 2008/0203422 A1 Aug. 28, 2008

(30) Foreign Application Priority Data

Feb. 26, 2007 (TW) .............................. 96106508 A

(51) Int. Cl.
*H01L 33/00* (2010.01)
(52) U.S. Cl. .................... 257/81; 257/99; 257/E33.065; 257/E33.056
(58) Field of Classification Search .................... 257/99, 257/E33.001, E33.057, E33.065, E33.066, 257/690, 692, E33.056, 81, 95; 29/25.01
See application file for complete search history.

(56) References Cited

U.S. PATENT DOCUMENTS

| | | | |
|---|---|---|---|
| 5,739,800 A * | 4/1998 | Lebby et al. | 345/82 |
| 5,982,636 A * | 11/1999 | Stahl et al. | 361/807 |
| 7,070,418 B1 | 7/2006 | Wang | |
| 7,125,152 B2 | 10/2006 | Lin et al. | |
| 2005/0085016 A1 * | 4/2005 | McWilliams et al. | 438/114 |
| 2006/0082315 A1 | 4/2006 | Chan | |
| 2008/0037225 A1 * | 2/2008 | Yang | 361/719 |
| 2008/0277684 A1 * | 11/2008 | Lin et al. | 257/99 |
| 2008/0283847 A1 * | 11/2008 | Moyer et al. | 257/81 |

FOREIGN PATENT DOCUMENTS

| | | |
|---|---|---|
| CN | 2795646 | 7/2006 |
| CN | 200983403 | 11/2007 |
| EP | 0870642 A2 | 10/1998 |
| JP | 64000719 A | 1/1989 |
| KR | 1020070016044 A | 7/2007 |
| TW | 520131 | 2/2003 |
| TW | M271334 | 7/2005 |
| TW | M310485 | 4/2007 |
| WO | WO 2004044877 A2 * | 5/2004 |
| WO | 2007/081152 A1 | 7/2007 |

* cited by examiner

*Primary Examiner* — Wael M Fahmy
*Assistant Examiner* — Sarah K Salerno
(74) *Attorney, Agent, or Firm* — Moser IP Law Group

(57) ABSTRACT

A structure of a light emitting diode is provided. The light emitting diode comprises a light emitting diode die; two conductive frames electronically and respectively connecting to the cathode and anode of the light emitting diode die, and two substrates. Each conductive frame has a fixing hole and each substrate has a protrusive pillar. The upper opening of the fixing hole is broader than the bottom opening. The protrusive pillar is inserted into the fixing hole and the shape of the protrusive pillar is deformed for fitting and binding with the fixing hole.

16 Claims, 5 Drawing Sheets

STRUCTURE OF LIGHT EMITTING DIODE AND METHOD TO ASSEMBLE THEREOF

RELATED APPLICATIONS

This application claims priority to Taiwan Application Serial Number 96106508, filed Feb. 26, 2007, which is herein incorporated by reference.

BACKGROUND

1. Field of Invention

The present invention relates to a light emitting diode structure. More particularly, the present invention relates to a fixing structure of a light emitting diode and a method to assemble thereof.

2. Description of Related Art

The manufacturing technology of light emitting diodes is getting advanced recently, so that the light emitting efficiency for light emitting diodes is accordingly improved. The application of light emitting diode is based on its good characters, such as low operating temperature and low power assumption, etc. Therefore, the light emitting diode is getting more used in the light emitting field. For example, the light emitting diode is introduced to manufacture flashlights or automobile headlights.

The normal LED (Light Emitting Diode) structure consists of the die that is attached to the leadframe with an electrically conductive glue. Gold wire is used to connect the metal contact on the top of the LED die to the adjacent pin. Finally, the epoxy package is molded around the leadframe. Pins set of the leadframe extends outside the LED package. The pins can be inserted into holes in a circuit board, and be fixed on the circuit board by welding. The temperature for welding can be up to hundreds of Celsius degrees, which may be conducted to LED die and make the die burn down.

A prior structure and method of fixing a LED package on a circuit board without welding is provided. Referring to FIG. 1, it illustrates a prior structure and method for fixing a LED package on a transferring board without welding. A LED package 10 includes a conductive leadframe 20. The conductive leadframe 20 has fixing holes 30. Corresponding to the locations of the fixing holes 30, holes 50 are formed by protruding from the bottom surface to the upper surface of a transferring board 40. After the holes 50 are formed, a fixing plate 60 is naturally formed from the protruding part of the holes 50. Referring to FIG. 2, it illustrates a prior structure of a LED package fixed on a transferring board without welding according to FIG. 1. The fixing plate 60 passes through the fixing holes 30, and the fixing plate 60 is bended inside out by using proper tools to fix the LED package 10 with the conductive leadframe 20 on the transferring board 40. The transferring board 40 can be used as a circuit board to transmit current to LED die and a media for heat-dissipation at the same time.

The prior structure and method for fixing a LED package on a transferring board can prevent high temperature which is generated by welding from the assembly processes. However, it is not easy to form a uniform fixing plate 60 by protruding out from the holes 50. Furthermore, the length of the fixing plate 60 is limited by the diameter of the holes 50, which is generally equal to the radii of the fixing holes 30. Referring to FIG. 3, it illustrates a prior structure and method for a fixing plate passing through a fixing hole. The included angle ⊖ between the fixing plate 60 and the transferring board 40 herein is larger than 90 degrees, so that the fixing plate 60 can pass through the fixing hole 30 easily. However, the included angle ⊖ would make it difficult to bend the fixing plate 60 inside out for the following bending process. On the contrary, the fixing plate 60 with the included angle ⊖ would be bended inwards, it accordingly reduce the efficiency for fixing the LED package 10 and the conductive leadframe 20 on the transferring board 40. Thus, for normally fixing the LED package 10 and the conductive leadframe 20 on the transferring board 40, the included angle ⊖ between the fixing plate 60 and the fixing holes 30 should be less than 90 degrees. That is, the fixing plate 60 should be bended inside out. However, it will make the fixing plate 60 passing through the fixing holes 30 difficulty. Therefore, after the fixing plate 60 passing through the fixing holes 30, it needs another process to deal with the included angle ⊖ between the fixing plate 60 and the transferring board 400. It's really a dilemma.

However, one more process will result in increasing cost and decreasing yield rate, even downgrading manufacture automation process. It is not the manufacturers wanted. Thus, it is very important to provide a simple and non-welding structure and method for fixing the LED package and the conductive leadframe on the transferring board.

SUMMARY

It is therefore, the present invention to provide a structure of a light emitting diode and a method to assemble thereof, such that the light emitting diode can be fixed on a substrate. The substrate includes a circuit board, a transferring board or any kind of carrying board which can be used for fixing the light emitting diode thereon.

The light emitting diode structure comprises conductive frames electronically and respectively connecting to a packaged die of the light emitting diode. Each conductive frame comprises fixing holes, which pass through the conductive frame. The top radius of the fixing hole (output opening) is broader than the bottom radius of the fixing hole (input opening). Therefore, the fixing hole may have an inclined sidewall from top to bottom, or the fixing hole may have a ladder-shaped sidewall. In addition, the design that top and bottom radii of the fixing hole are broader than the middle radius of the fixing hole is also within the scope of the present invention. Besides, the fixing hole also can be set on the substrate. The bottom radius of the fixing hole is broader than the top radius of the fixing hole on the substrate. Therefore, the fixing hole may have an inclined sidewall from bottom to top, or the fixing hole may have a reversed-ladder shaped sidewall.

In one of the embodiments, a protrusive pillar is set on the substrate. The material of the protrusive pillar is a kind of conductive and expandable material, such as metal. The protrusive pillar can be a cylinder or hollow pillar. Generally, the hollow pillar is more deformable than the cylinder pillar. The cross-sectional area of the protrusive pillar can be equal to or smaller than the area of the bottom of the fixing hole or the cross-sectional area with the smallest radius of the fixing hole. Of course, the cross-sectional area of the protrusive pillar is not limited in the above-mentioned requirement. Any one of the protrusive pillar can pass through the input opening and protrude out of the output opening of the fixing hole is within the scope of the present invention. In addition, in the other embodiment, the protrusive pillar can be set on the surface of the conductive frame corresponding to the substrate, rather than set on the substrate.

In accordance with the foregoing disclosed structures of the present invention, a method for assembling a light emitting diode is provided. When a protrusive pillar passes through the fixing hole, the light emitting diode is not fixed yet. The protrusive pillar is then pressed by tools, and is deformed to hook the fixing hole. That is, the protrusive pillar fills the fixing holes, or the outer sidewalls of the protrusive pillar adhere to the inner inclined sidewalls of the fixing holes closely, so that the light emitting diode can be fixed on the substrate. The present method for assembling a light emitting diode without welding is easy and efficient. Therefore, the present invention provides a light emitting diode and a method to assemble thereof with low cost, high production rate and high yield rate.

These and other features, aspects, and advantages of the present invention will become better understood with reference to the following description, figures, and appended claims.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
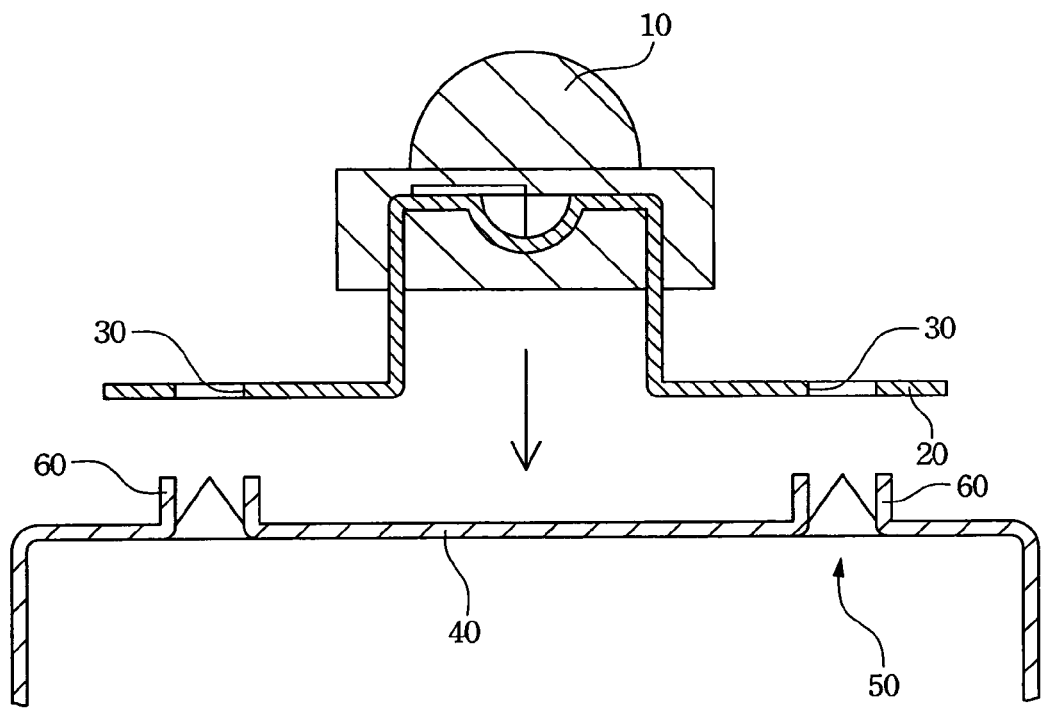
FIG. 1 is a prior structure and method for fixing a packaged light emitting diode on a transferring board without welding.
Figure 2:
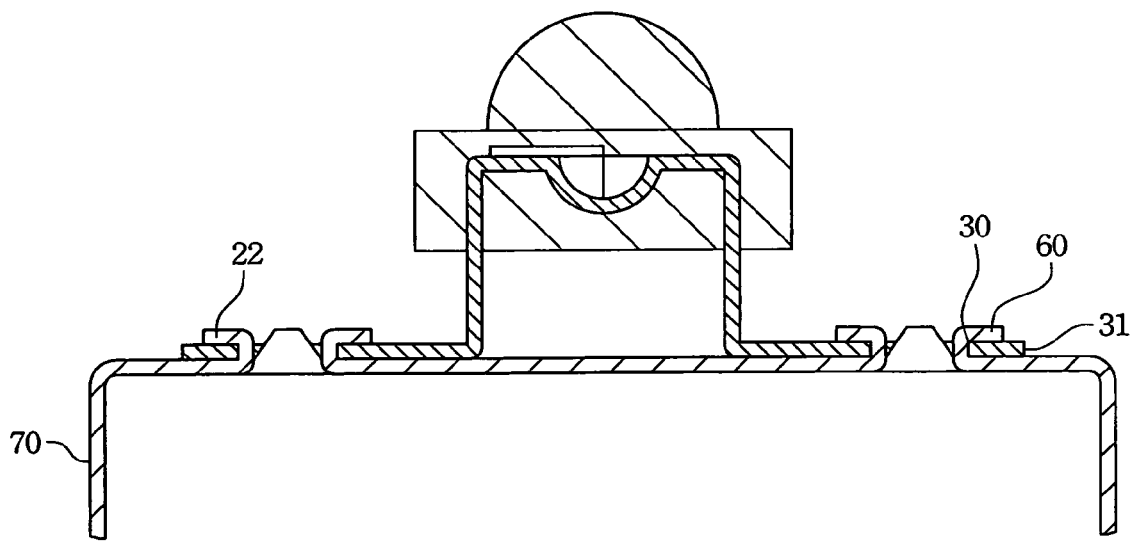
FIG. 2 is a prior structure of a light emitting diode fixed on a transferring board without welding according to FIG. 1.
Figure 3:
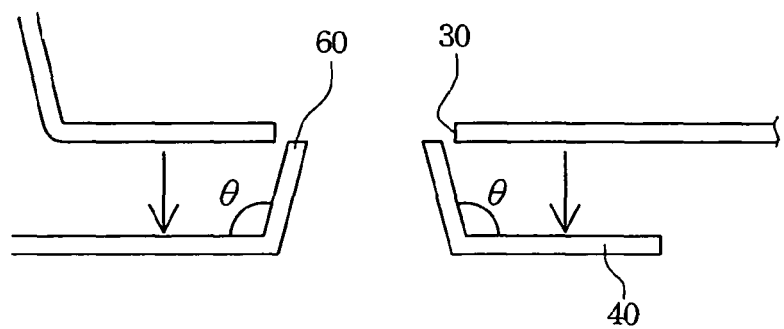
FIG. 3 is a prior structure and method for a fixing plate passing through a fixing hole.

The present invention provides a fixing structure of a light emitting diode, which uses riveting process rather than welding process for fixing the light emitting diode on a substrate to prevent the damage of the light emitting diode chip from high temperature of the welding process. Reference will now be made in detail to the present preferred embodiments of the invention, examples of which are illustrated in the accompanying drawings. Wherever possible, the same reference numbers are used in the drawings and the description to refer to the same or like parts.

Figure 4:
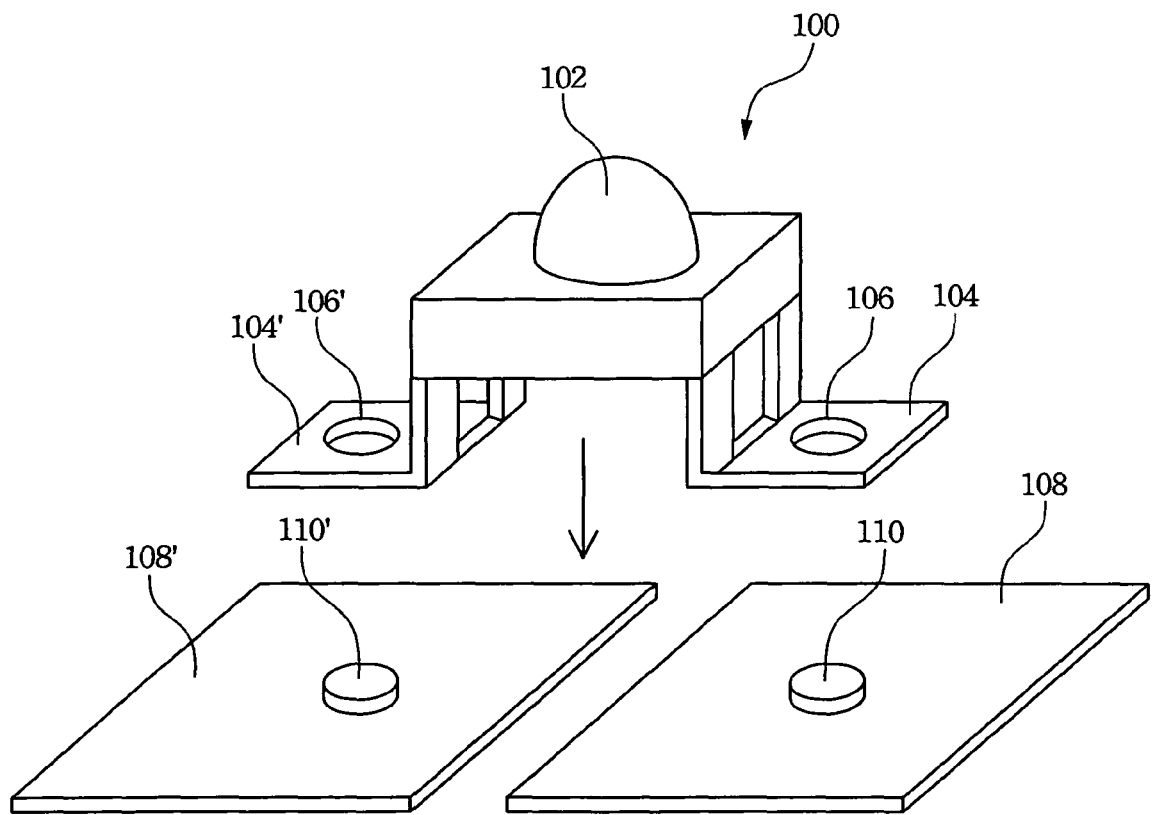
FIG. 4 is a three-dimensional explosion diagram illustrating a structure of a light emitting diode according to first preferred embodiment of the present invention.

Referring to FIG. 4, it is a three-dimensional explosion diagram illustrating a structure of a light emitting diode according to first preferred embodiment of the present invention. As shown in FIG. 4, a packaged light emitting diode 100 has a packaged die 102 and conductive frames 104 and 104'. The conductive frames 104 and 104' electrically connect to the cathode and anode of the light emitting diode respectively (not shown). The conductive frames 104 and 104' have fixing holes 106 and 106' respectively.

Continue to FIG. 4. Protrusive pillars 110 and 110' are set on two substrates 108 and 108' respectively. According to the first preferred embodiment of the present invention, the protrusive pillars 110 and 110' can be hollow cylinders. The protrusive pillars 110 and 110' are drawn to cylinders by pressing mold technic. Of course, the above-mentioned example is one of the embodiments of the present invention, the protrusive pillars 110 and 110' are not limited to cylinders or hollow pillars, and are not limited to be formed in one piece (in an integral) with substrates 108 and 108'. A hollow or non-hollow pillar can be pressed into or screwed into the holes of the substrate.

Figure 5A:
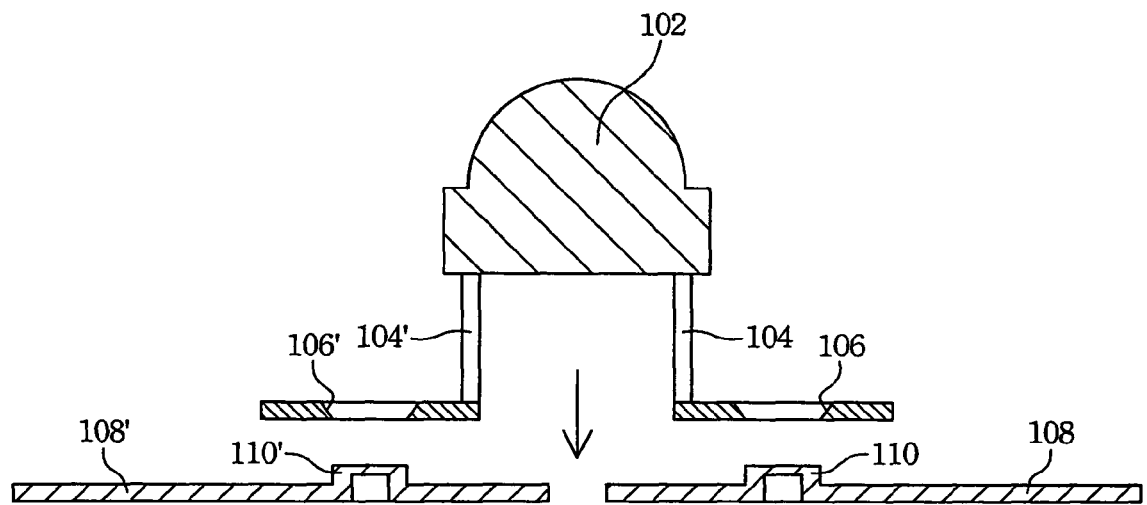
FIG. 5A is a cross-sectional view illustrating a structure and method for fixing a light emitting diode on a substrate according to first preferred embodiment of the present invention.

Referring to FIG. 5A, it is a cross-sectional view illustrating a structure and method for fixing a light emitting diode on a substrate according to first preferred embodiment of the present invention. A light emitting diode 100 has a packaged die 102 and conductive frames 104 and 104'. The conductive frames 104 and 104' electrically connect to the cathode and anode of packaged die 102 of the light emitting diode respectively (not shown). The conductive frames 104 and 104' have fixing holes 106 and 106' respectively. Protrusive pillars 110 and 110' are set on the two substrates 108 and 108' respectively. The protrusive pillars 110 and 110' can be hollow pillars. As shown in FIG. 5A, the protrusive pillar 110 passes through the fixing hole 106 and combines with the fixing hole 106, and the protrusive pillar 110' passes through the fixing hole 106' and combines with the fixing hole 106'.

Figure 5B:
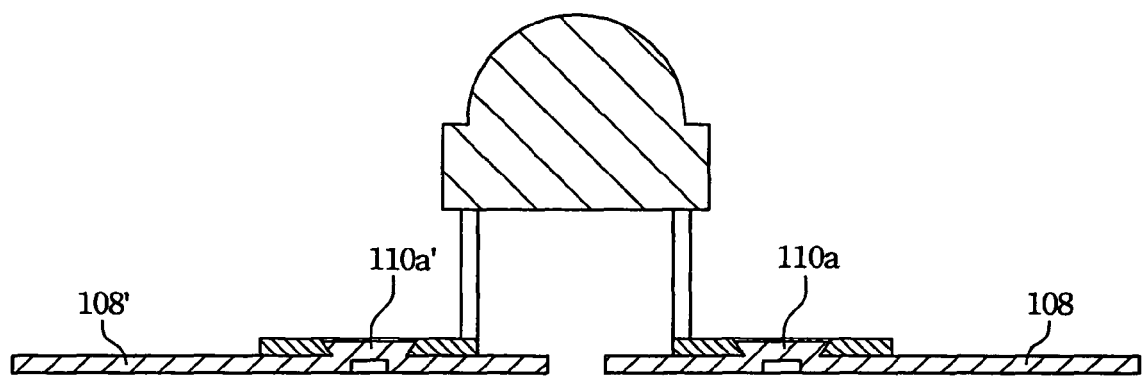
FIG. 5B is a cross-sectional view illustrating a structure of a light emitting diode fixed on a substrate according to first preferred embodiment of the present invention.

Referring to FIG. 5B, it is a cross-sectional view illustrating a structure of a light emitting diode fixed on a substrate according to first preferred embodiment of the present invention. As shown in FIG. 5B, the protrusive pillars 110 and 110' in FIG. 5A pass through the fixing hole 106 and combine with the fixing holes 106 and 106' respectively. The protrusive pillars 110 and 110' protrude out from the top surface of the substrates 108 and 108' respectively. A pressing process then performs on the protrusive pillars 110 and 110' by using proper tools, so that the protrusive pillars 110 and 110' in FIG. 5A are deformed to become protrusive pillars 110a and 110a' in FIG. 5B and fill the fixing holes 106 and 106'. According to other embodiments of the present invention, the outer sidewalls of the protrusive pillars 110a and 110a' can adhere to the inner sidewalls of the fixing holes 106 and 106' closely and not fill the fixing holes 106 and 106'. Generally, the height of the top surfaces of the protrusive pillars 110a and 110a' can be equal to, slightly higher than or slightly lower than the height of the top surfaces of the fixing holes 106 and 106'.

Figure 6A:
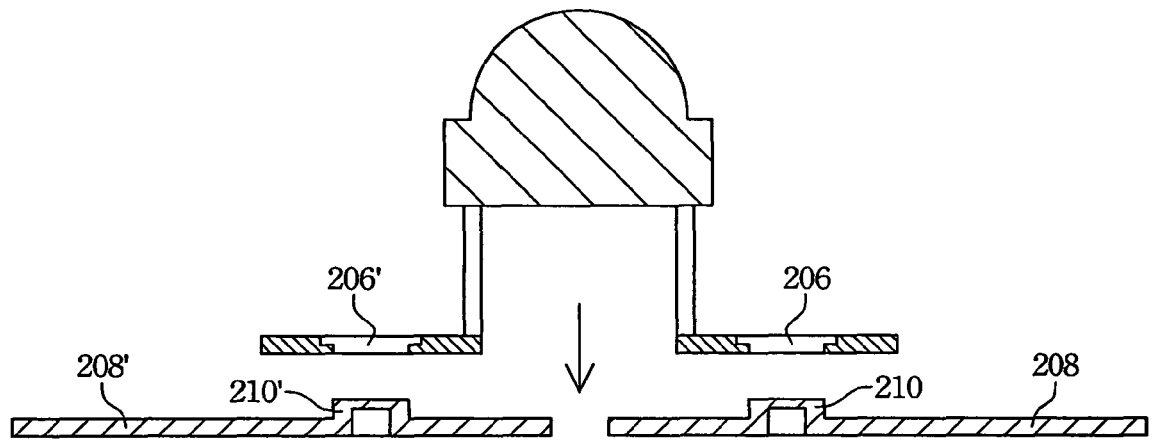
FIG. 6A is a cross-sectional view illustrating a structure and method for fixing a light emitting diode on a substrate according to second preferred embodiment of the present invention.

Please refer to FIG. 6A. It is a cross-sectional view illustrating a structure and method for fixing a light emitting diode on a substrate according to second preferred embodiment of the present invention. And referring to FIG. 6B, it is a cross-sectional view illustrating a structure of a light emitting diode fixed on a substrate according to second preferred embodiment of the present invention. The differences between the embodiment of FIGS. 6A and 6B and the embodiment of FIGS. 5A and 5B are that the shapes of fixing holes 206 and 206' differ from the fixing holes 106 and 106'. As shown in FIG. 6A, the cross-sectional view of the fixing hole 206 is in a ladder shape. When protrusive pillars 210 and 210' are inserted into the fixing holes 206 and 206', a pressing process then performs on the protrusive pillars 210 and 210' by using proper tools. The protrusive pillars 210 and 210' in FIG. 6A are deformed into protrusive pillars 210a and 210a' in FIG. 6B and fill the fixing holes 206 and 206'. Of course, the outer sidewalls of the protrusive pillars 210a and 210a' may adhere to the inner sidewalls of the fixing holes 206 and 206' closely and not fill the fixing holes 206 and 206'.

Figure 7:
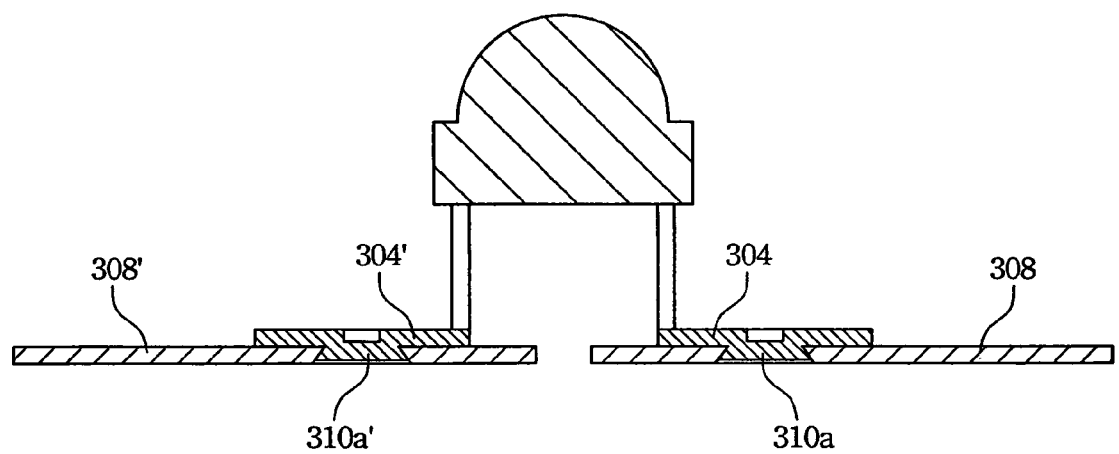
FIG. 7 is a cross-sectional view illustrating a structure of a light emitting diode fixed on a substrate according to third preferred embodiment of the present invention.
Figure 8:
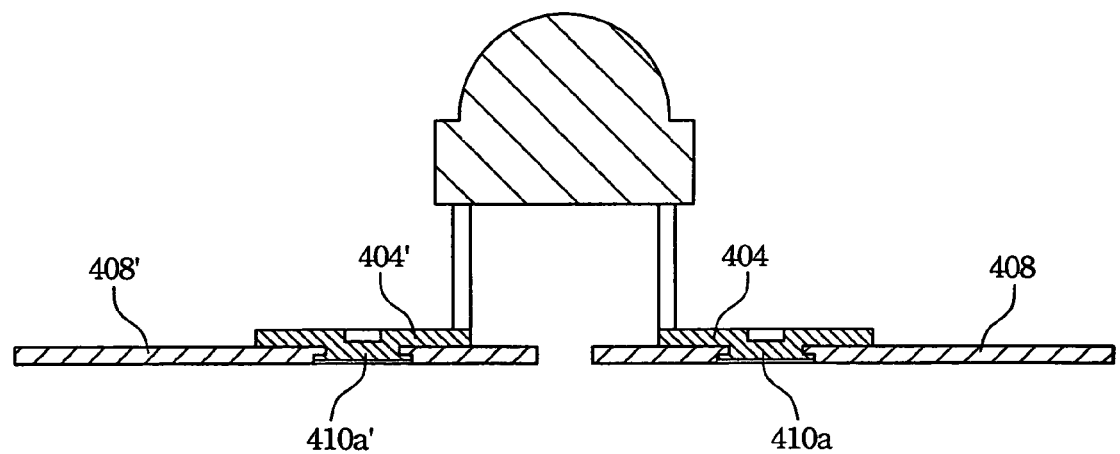
FIG. 8 is a cross-sectional view illustrating a structure of a light emitting diode fixed on a substrate according to fourth preferred embodiment of the present invention.

Please refer to both FIGS. 7 and 8. FIG. 7 is a cross-sectional view illustrating a structure of a light emitting diode fixed on a substrate according to third preferred embodiment of the present invention. FIG. 8 is a cross-sectional view illustrating a structure of a light emitting diode fixed on a substrate according to fourth preferred embodiment of the present invention. As shown in FIG. 7, the structure of the third preferred embodiment of the present invention in FIG. 7 is like the structure of the first preferred embodiment of the present invention in FIG. 5B. The only difference between FIG. 7 and FIG. 5B is that the locations of the protrusive pillars 310a and 310a' in FIG. 7 and the locations of the protrusive pillars 110a and 110a' in FIG. 5B are different. The protrusive pillars 110a and 110a' in FIG. 5B are set on the substrates 108 and 108' respectively, while the protrusive pillars 310a and 310a' in FIG. 7 are set on the conductive frames 304 and 304' respectively. In detail, the protrusive pillars 310a and 310a' in FIG. 7 are set on the surfaces of the conductive frames 304 and 304' in correspondence with to the substrates 308 and 308' respectively. Other characters of the third preferred embodiment of the present invention are the same with the first preferred embodiment of the present invention and can refer to the above description for the first preferred embodiment of the present invention.

Figure 6B:
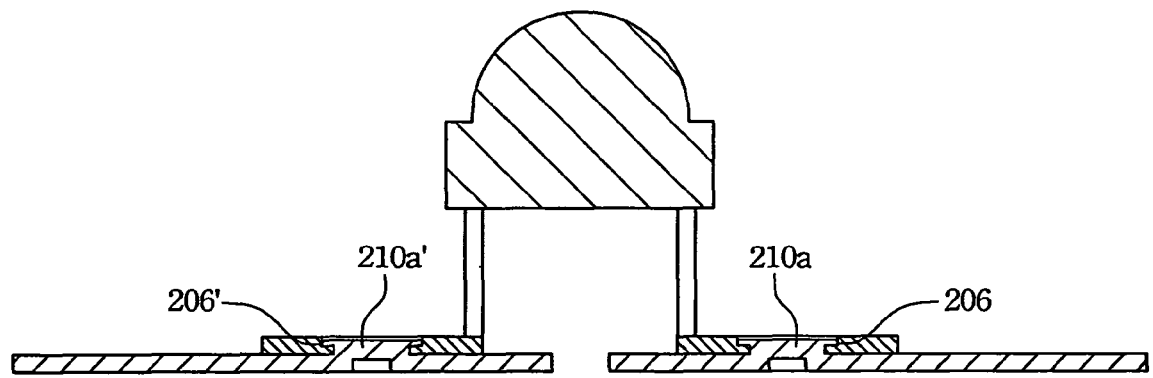
FIG. 6B is a cross-sectional view illustrating a structure of a light emitting diode fixed on a substrate according to second preferred embodiment of the present invention.

Referring to FIG. 8, the structure of the fourth preferred embodiment of the present invention in FIG. 8 is like the structure of the second preferred embodiment of the present invention in FIG. 6B. The only difference between FIG. 8 and FIG. 6B is that the locations of the protrusive pillars 410a and 410a' in FIG. 8 differ from the locations of the protrusive pillars 210a and 210a' in FIG. 6B. The protrusive pillars 210a and 210a' in FIG. 6B are set on the substrates 208 and 208' respectively, while the protrusive pillars 410a and 410a' in FIG. 8 are set on the conductive frames 404 and 404' respectively. In detail, the protrusive pillars 410a and 410a' in FIG. 8 are set on the surfaces of the conductive frames 404 and 404' corresponding to the substrates 408 and 408' respectively. Other characters of the fourth preferred embodiment of the present invention are the same with the second preferred embodiment of the present invention and can refer to the above description for the second preferred embodiment of the present invention.

In the above-mentioned embodiments of the present invention, the substrates can be used as circuit boards to transmit current to light emitting diode package. The protrusive pillars are added on the circuit board herein. The materials of the substrates can be metal, such as gold, silver, copper, aluminum, nickel, chromium, iron, or an alloy composed of the above-mentioned metals. The metal substrates not only can form a transmissible route for working current, but also can provide a heat-dissipation surface for the light emitting diode, so that the heat-dissipation efficiency is improved to prolong the lifetime of the light emitting diode.

According to the above-mentioned embodiments of the present invention, there are some advantages described as follows. The present structure of a light emitting diode and a method to assemble thereof is very easy and efficient, and does not need any welding process at all. Therefore, the present structure and method for fixing a LED package on a transferring board can reduce cost, and provide high production rate and high yield rate.

Although there are some embodiments have been disclosed above, they are not used to limit the scope of the present invention. It will be apparent to those skilled in the art that various modifications and variations can be made to the structure and method of the present invention without departing from the scope or spirit of the invention. For example, the protrusive pillar can be pressed and deformed to fix on the top surface of the conductive frame or on the bottom surface of the substrate. A fixing hole with straight inner sidewall can be used at this time. In view of the foregoing, it is intended that the present invention covers modifications and variations of this invention provided they fall within the scope of the following claims and their equivalents.

What is claimed is:

1. A light emitting diode structure, comprising:
   a light emitting diode;
   at least two conductive frames electrically connecting to the light emitting diode respectively, wherein each conductive frame has a fixing hole with an inclined inner sidewall and an output opening of the fixing hole is broader than an input opening of the fixing hole; and
   at least two substrates each having a protrusive pillar correspondingly located in the fixing hole, wherein each pillar is deformed to fill the fixing hole and to adhere to the inclined inner sidewall of the fixing hole, and a top surface of each pillar does not protrude out of a top surface of each corresponding conductive frame.

2. The light emitting diode structure of claim 1, wherein the protrusive pillar is a hollow pillar.

3. The light emitting diode structure of claim 1, wherein the substrates comprise a circuit board, a transferring board or a carrying board.

4. The light emitting diode structure of claim 1, wherein the protrusive pillar is a cylinder.

5. The light emitting diode structure of claim 1, wherein the conductive frames are made of metal.

6. A light emitting diode structure, comprising:
   a light emitting diode;
   at least two substrates each having a fixing hole with an inclined inner sidewall and an output opening of the fixing hole is broader than an input opening of the fixing hole; and
   at least two conductive frames electrically connecting to the light emitting diode respectively, each conductive frame having a downward protrusive pillar correspondingly located in the fixing hole, wherein each pillar is deformed to fill in the fixing hole and to adhere to the inclined inner sidewall of the fixing hole, and a bottom surface of each pillar does not protrude out of a bottom surface of each corresponding substrate.

7. The light emitting diode structure of claim 6, wherein the protrusive pillar is a hollow pillar.

8. The light emitting diode structure of claim 6, wherein the substrates comprise a circuit board, a transferring board or a carrying board.

9. The light emitting diode structure of claim 6, wherein the protrusive pillar is a cylinder.

10. The light emitting diode structure of claim 6, wherein the conductive frames are made of metal.

11. A light emitting diode structure, comprising:
    a light emitting diode;

at least two conductive frames electrically connecting to the light emitting diode respectively, each conductive frame having a fixing hole with an inner sidewall and an output opening of the fixing hole is broader than an input opening of the fixing hole; and at least two substrates each having a protrusive pillar correspondingly located in the fixing hole, wherein each pillar is deformed to fill the fixing hole and to adhere to the inner sidewall of the fixing hole, and a top surface of each pillar and a top surface of each corresponding conductive frame are substantially coplanar.

12. The light emitting diode structure of claim 11, wherein the protrusive pillar is a hollow pillar.

13. The light emitting diode structure of claim 11, wherein the inner sidewall is an inclined inner sidewall.

14. The light emitting diode structure of claim 11, wherein the substrates comprise a circuit board, a transferring board or a carrying board.

15. The light emitting diode structure of claim 11, wherein the protrusive pillar is a cylinder.

16. The light emitting diode structure of claim 11, wherein the conductive frames are made of metal.

* * * * *